(12) United States Patent
Altolaguirre et al.

(10) Patent No.: US 11,881,847 B2
(45) Date of Patent: Jan. 23, 2024

(54) POST DRIVER AND CHIP WITH OVERDRIVE CAPABILITY

(71) Applicant: MEDIATEK INC., Hsinchu (TW)

(72) Inventors: Federico Agustin Altolaguirre, Hsinchu (TW); Hsin-Cheng Hsu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/811,912

(22) Filed: Jul. 12, 2022

(65) Prior Publication Data

US 2023/0081401 A1  Mar. 16, 2023

Related U.S. Application Data

(60) Provisional application No. 63/243,764, filed on Sep. 14, 2021.

(51) Int. Cl.
*H03K 17/082* (2006.01)

(52) U.S. Cl.
CPC ................ *H03K 17/0822* (2013.01)

(58) Field of Classification Search
CPC ......... H03K 17/0822; H03K 19/00315; H03K 19/017509; H03K 19/018521
See application file for complete search history.

(56) References Cited

U.S. PATENT DOCUMENTS

| | | |
|---|---|---|
| 6,081,152 A | 6/2000 | Maley |
| 8,791,724 B1 | 7/2014 | Huang et al. |
| 8,847,636 B2 * | 9/2014 | Kerr ................ H03K 19/00315 327/170 |
| 8,994,412 B2 * | 3/2015 | Kim ................ H03K 3/356165 327/109 |
| 9,948,283 B2 * | 4/2018 | Takayanagi ...... H03K 3/356113 |
| 10,075,157 B1 | 9/2018 | Den Hartog et al. |
| 2003/0076636 A1 | 4/2003 | Ker et al. |
| 2014/0103966 A1 | 4/2014 | Wang et al. |

FOREIGN PATENT DOCUMENTS

| | | |
|---|---|---|
| CN | 100481667 C | 4/2009 |
| TW | I499901 B | 9/2015 |

OTHER PUBLICATIONS

Extended European Search Report dated Feb. 14, 2023, issued in application No. EP 22194429.1.
Chinese language office action dated Aug. 31, 2023, issued in application No. TW 111129252.

* cited by examiner

*Primary Examiner* — Ryan Johnson
*Assistant Examiner* — Colleen J O Toole
(74) *Attorney, Agent, or Firm* — McClure, Qualey & Rodack, LLP

(57) ABSTRACT

A post driver and a chip with overdrive capability are shown. A first bias circuit is configured to provide a first voltage shift between the output terminal of the post driver and the gate terminal of the first p-channel metal-oxide-semiconductor (PMOS) transistor of a pull-up circuit when the pull-down circuit is enabled. A second bias circuit is configured to provide a second voltage shift between the output terminal of the post driver and the gate terminal of the first n-channel metal-oxide-semiconductor (NMOS) transistor of the pull-down circuit when the pull-up circuit is enabled. Accordingly, the PMOS transistors in the pull-up circuit and the NMOS transistors in the pull-down circuit are all well protected although they are powered by an overdrive voltage.

21 Claims, 3 Drawing Sheets

POST DRIVER AND CHIP WITH OVERDRIVE CAPABILITY

CROSS REFERENCE TO RELATED APPLICATIONS

This application claims the benefit of U.S. Provisional Application No. 63/243,764, filed Sep. 14, 2021, the entirety of which is incorporated by reference herein.

BACKGROUND OF THE INVENTION

Field of the Invention

The present invention relates to a post driver and a chip with overdrive capability.

Description of the Related Art

As the technology used in semiconductor manufacturing develops (e.g., scaling down to 5 nm, 4 nm, 3 nm, or below), it has become possible for the maximum applied voltage to be suppressed (e.g., much lower than the maximum applied voltage on 7 nm products). If there are several generations of chips on the same printed circuit board (PCB), an overdrive design is required. For example, the power system does not only provide 1.5V for new-generation chips but it also provides 3.3V for old-generation chips, meaning that there is a need for an overdrive technology for the new-generation chips.

Generally, compared to the nominal voltage VDD used to operate the new-generation transistors, overdrive voltage uses twice the nominal voltage VDD plus a delta voltage VX. For example, the nominal voltage VDD may be 1.5V while the overdrive voltage (2VDD+VX) is 3.3V. The delta voltage VX, 0.3V, may result in damage to the transistors. For example, a gate-drain voltage may be up to VDD+VX, greater than the nominal voltage VDD and damages the transistor. Furthermore, multiplexers may be required in a conventional overdrive design, which may result in reliability issues. A new overdrive design is required.

BRIEF SUMMARY OF THE INVENTION

An exemplary embodiment of the present invention introduces a post driver and a chip with overdrive capability.

A post driver in accordance with an exemplary embodiment of the present invention has a pull-up circuit, a pull-down circuit, a first bias circuit, and a second bias circuit. The pull-up circuit has a plurality of p-channel metal-oxide-semiconductor (PMOS) transistors coupled in series between the overdrive voltage source (2VDD+VX) and the output terminal of the post driver, wherein a first PMOS transistor has a drain terminal coupled to the output terminal of the post driver. The pull-down circuit has a plurality of n-channel metal-oxide-semiconductor (NMOS) transistors coupled in series between the output terminal of the post driver and a ground terminal, wherein a first NMOS transistor has a drain terminal coupled to the output terminal of the post driver. The first bias circuit is configured to provide a first voltage shift (VX) between the output terminal of the post driver and the gate terminal of the first PMOS transistor when the pull-down circuit is enabled, to increase the voltage level at the gate terminal of the first PMOS transistor when the pull-down circuit is enabled. The second bias circuit is configured to provide a second voltage shift (VX) between the output terminal of the post driver and the gate terminal of the first NMOS transistor when the pull-up circuit is enabled, to decrease the voltage level at the gate terminal of the first NMOS transistor when the pull-up circuit is enabled.

The first bias circuit may include a plurality of diodes which are coupled in series to provide the first voltage shift (≈VX) when the pull-down circuit is enabled.

The second bias circuit may include a plurality of diodes which are coupled in series to provide the second voltage shift (≈VX) when the pull-up circuit is enabled.

The post driver may further have a third PMOS transistor, having a gate terminal coupled to a drain terminal of a second NMOS transistor, a drain terminal biased by the nominal voltage VDD, and a source terminal coupled to the gate terminal of the first NMOS transistor.

The post driver may further have a third NMOS transistor, having a gate terminal coupled to the drain terminal of the second PMOS transistor, a drain terminal biased by the protection voltage (VDD+VX), and a source terminal coupled to the gate terminal of the first PMOS transistor.

A chip in accordance with an exemplary embodiment of the present invention includes the aforementioned post driver and a control circuit. The control circuit provides a first control signal and a second control signal to control the pull-up circuit and the pull-down circuit of the post driver.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
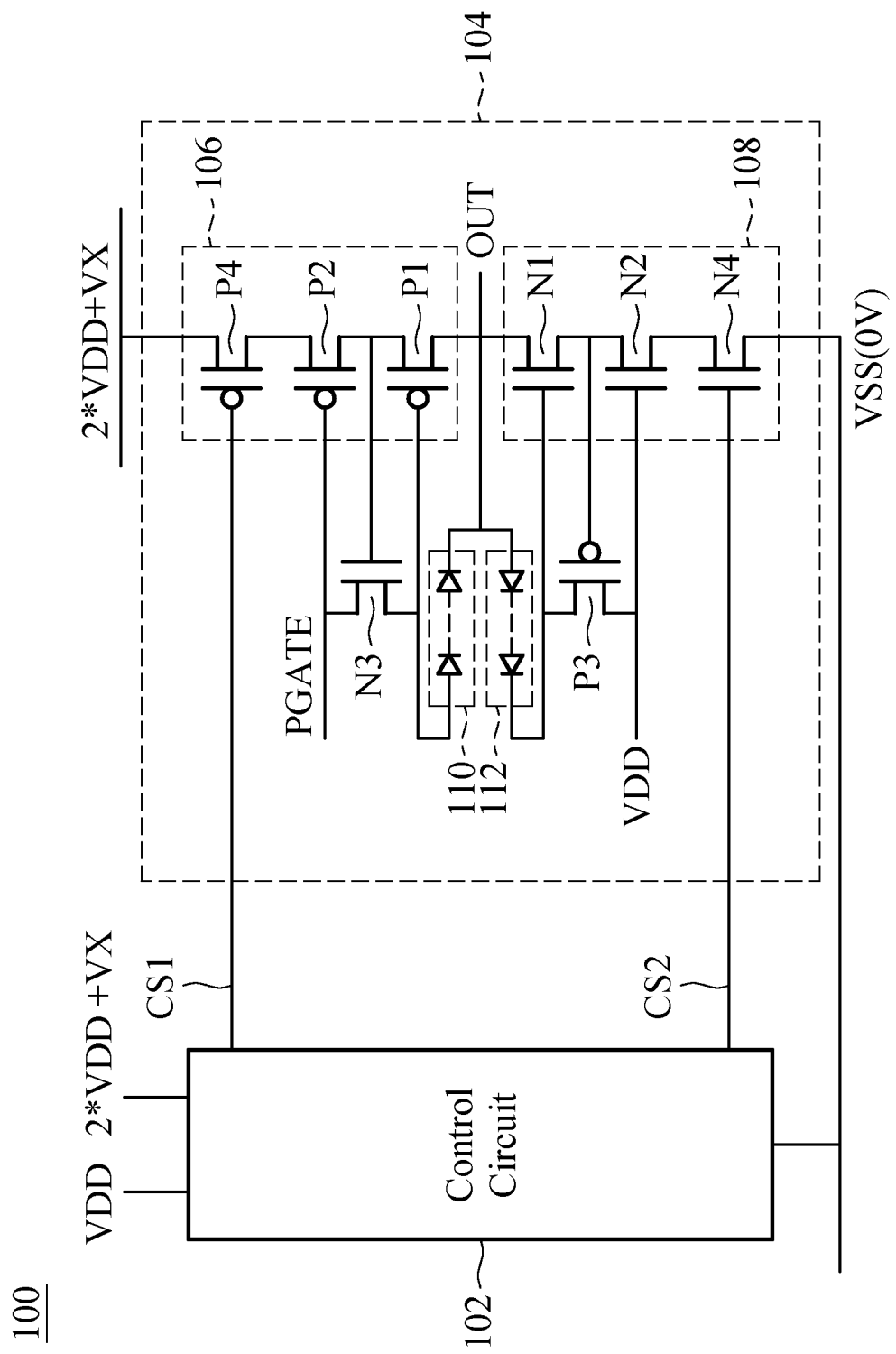
FIG. 1 shows a chip 100 with overdrive capability in accordance with an exemplary embodiment of the present invention.

FIG. 1 shows a chip 100 with overdrive capability in accordance with an exemplary embodiment of the present invention. The chip 100 includes a control circuit 102 and a post driver 104. The post drive 104 has a pull-up circuit 106, a pull-down circuit 108, a first bias circuit 110, and a second bias circuit 112. The control circuit 102 provides a first control signal CS1 and a second control signal CS2 to control the pull-up circuit 106 and the pull-down circuit 108 of the post driver 104. The details of the post driver 104 are described in the following paragraphs.

The pull-up circuit 106 has a plurality of p-channel metal-oxide-semiconductor (PMOS) transistors P1, P2 and P4 coupled in series between an overdrive voltage source (2VDD+VX) and an output terminal OUT of the post driver 104. The PMOS transistor P1 has a drain terminal coupled to the output terminal OUT of the post driver 104. The pull-down circuit 108 has a plurality of n-channel metal-oxide-semiconductor (NMOS) transistors N1, N2 and N4 coupled in series between the output terminal OUT of the post driver 104 and a ground terminal VSS(0V). The NMOS transistor N1 has a drain terminal coupled to the output terminal OUT of the post driver 104. The first bias circuit 110 is configured to provide a first voltage shift (≈VX) between the output terminal OUT of the post driver 104 and the gate terminal of the PMOS transistor P1 when the pull-down circuit 108 is enabled. The voltage level at the gate terminal of the PMOS transistor P1 is increased by the first voltage shift (≈VX), (e.g., it raises to VX rather than being locked at 0V) when the pull-down circuit 108 is enabled, and the operating voltages supplied on the series of PMOS transistors P1, P2 and P4 in the pull-up circuit 106 are thereby protected within a safe region (within the nominal voltage VDD to avoid the dangerous cross voltage VDD+VX). The PMOS transistors P1, P2 and P4 are all well protected. The second bias circuit 112 is configured to provide a second voltage shift (≈VX) between the output terminal OUT of the post driver 104 and the gate terminal of the NMOS transistor N1 when the pull-up circuit 106 is enabled. The voltage level at the gate terminal of the NMOS transistor N1 is decreased by the second voltage shift (≈VX), (e.g., it drops to 2VDD rather than being locked at 2VDD+VX) when the pull-up circuit 106 is enabled, and thereby the series of NMOS transistors N1, N2 and N4 in the pull-down circuit 108 are protected within a safe region (within the nominal voltage VDD to avoid the dangerous cross voltage VDD+VX). The NMOS transistors N1, N2 and N4 are all well protected.

In such a design, the overdrive voltage source provides an overdrive voltage that is twice the nominal voltage VDD of the post driver 104 plus a delta voltage VX, and the first voltage shift and the second voltage shift depend on the delta voltage VX (for example, to balance the delta voltage VX). In FIG. 1, diode strings are used. The first bias circuit 110 comprises a plurality of diodes coupled in series to provide the first voltage shift (≈VX) when the pull-down circuit 108 is enabled. For example, there may be N diodes (each with a diode voltage VD) in the first bias circuit 110, and N*VD equals the delta voltage VX. The second bias circuit 112 comprises a plurality of diodes coupled in series to provide the second voltage shift (≈VX) when the pull-up circuit 106 is enabled. For example, there may be N diodes (each with a diode voltage VD) in the second bias circuit 112, and N*VD equals the delta voltage VX.

The structure of the post driver 104 is detailed further below. The PMOS transistor P2 has a drain terminal coupled to the source terminal of the PMOS transistor P1, and a gate terminal biased by the protection voltage PGATE that is the nominal voltage VDD plus the delta voltage VX. The NMOS transistor N2 has a drain terminal coupled to the source terminal of the NMOS transistor N1, and a gate terminal biased by the nominal voltage VDD. The post driver 104 also has an NMOS transistor N3 and a PMOS transistor P3. The NMOS transistor N3 has a gate terminal coupled to the drain terminal of the PMOS transistor P2, a drain terminal biased by the protection voltage PGATE (=VDD+VX), and a source terminal coupled to the gate terminal of the PMOS transistor P1. The PMOS transistor P3 has a gate terminal coupled to the drain terminal of the NMOS transistor N2, a drain terminal biased by the nominal voltage VDD, and a source terminal coupled to the gate terminal of the NMOS transistor N1. Referring to the pull-up circuit 106, the PMOS transistor P4 has a source terminal coupled to the overdrive voltage source 2VDD+VX, a drain terminal coupled to a source terminal of the PMOS transistor P2, and a gate terminal receiving the first control signal CS1.

Referring to the pull-down circuit 108, the NMOS transistor N4 has a source terminal coupled to the ground terminal VSS(=0V), a drain terminal coupled to a source terminal of the NMOS transistor N2, and a gate terminal receiving the second control signal CS2.

To enable the pull-up circuit 106 and disable the pull-down circuit 108, the control circuit 102 outputs the protection voltage PGATE (VDD+VX) as the first control signal CS1, and outputs a ground voltage 0V as the second control signal CS2. To disable the pull-up circuit 106 and enable the pull-down circuit 108, the control circuit 102 outputs the overdrive voltage (2VDD+VX) as the first control signal CS1, and outputs the nominal voltage VDD as the second control signal CS2.

Note that the NMOS transistor N3 replaces a conventional multiplexer that was used to change the state of the gate terminal of the PMOS transistor P1, and the PMOS transistor P3 replaces a conventional multiplexer that was used to change the state of the gate terminal of the NMOS transistor N1. Without the conventional multiplexers, the reliability problems due to the multiplexers are removed.

Figure 2A:
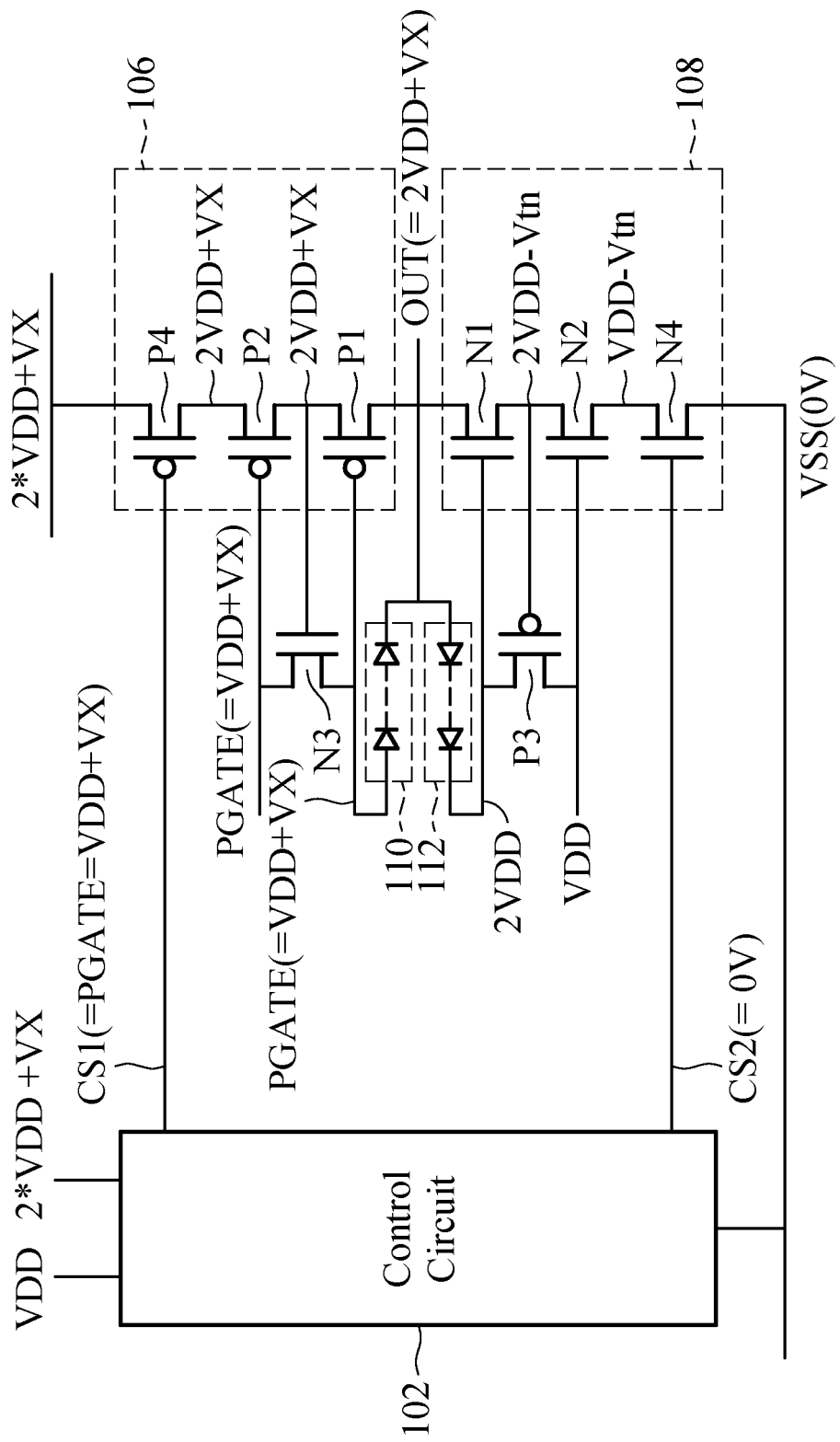
FIG. 2A shows a state wherein the pull-up circuit 106 is enabled, and the pull-down circuit 108 is disabled.

FIG. 2A shows a state wherein the pull-up circuit 106 is enabled, and the pull-down circuit 108 is disabled. In such a situation, the control circuit 102 outputs the protection voltage PGATE (VDD+VX) as the first control signal CS1, and outputs a ground voltage 0V as the second control signal CS2. In response to the first control signal CS1 (=PGATE=VDD+VX), the PMOS transistor P4 is turned-on, the drain terminal of the PMOS transistor P4 is at the overdrive voltage 2VDD+VX, the PMOS transistor P2 is tuned on, the drain terminal of the PMOS transistor P2 is at the overdrive voltage 2VDD+VX, the NMOS transistor N3 is turned on, the gate terminal of the PMOS transistor P1 is at the protection voltage PGATE (=VDD+VX), the PMOS transistor P1 is turned on, and the output terminal OUT is successfully pulled up to the overdrive voltage 2VDD+VX. The PMOS transistors P1, P2 and P4 and the NMOS transistor N3 are all well protected within the nominal voltage VDD. As for the pull-down circuit 108, in response to the second control signal CS2 (=0V), the NMOS transistors N1, N2 and N4, and the PMOS transistor P3 are all turned off. Note that by the second bias circuit 112, the gate terminal of the NMOS transistor N1 is at 2VDD (=(2VDD+VX)−VX), and the source terminal of the NMOS transistor N1 is at 2VDD-Vtn (wherein Vtn is a threshold voltage of an NMOS transistor). The voltage difference between the drain terminal and the gate terminal of the NMOS transistor N2 is (2VDD−Vtn)−VDD, which is VDD-Vtn, and within the nominal voltage VDD. Not only are transistors N1, N4 and P3 protected, but the NMOS transistor N2 is also well protected within the nominal voltage VDD.

Figure 2B:
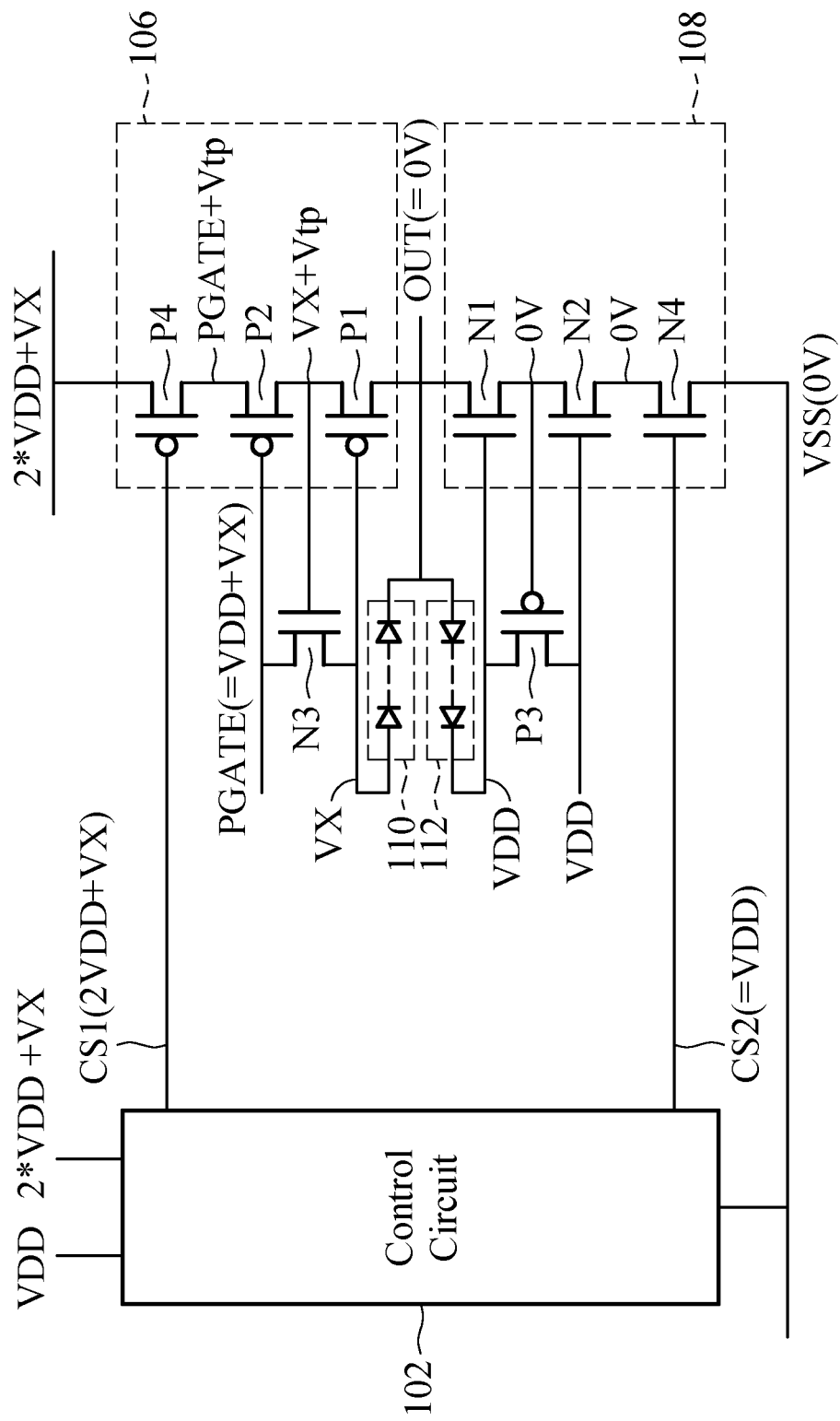
FIG. 2B shows a state wherein the pull-down circuit 108 is enabled, and the pull-up circuit 106 is disabled.

FIG. 2B shows a state wherein the pull-down circuit 108 is enabled, and the pull-up circuit 106 is disabled. In such a situation, the control circuit 102 outputs the overdrive voltage (2VDD+VX) as the first control signal CS1, and outputs the nominal voltage VDD as the second control signal CS2. In response to the second control signal CS2 (=VDD), the NMOS transistor N4 is turned-on, the drain terminal of the NMOS transistor N4 is at 0V, the NMOS transistor N2 is tuned on, the drain terminal of the NMOS transistor N2 is at 0V, the PMOS transistor P3 is turned on, the gate terminal of the NMOS transistor N1 is at the nominal voltage VDD, the NMOS transistor N1 is turned on, and the output terminal OUT is successfully pulled down to the ground voltage 0V. The NMOS transistors N1, N2 and N4 and the PMOS transistor P3 all are well protected within the nominal voltage VDD. As for the pull-up circuit 106, in response to the first control signal CS1 (=2VDD+VX), the PMOS transistors P1, P2 and P4, and the NMOS transistor N3 are all turned off. Note that by the first bias circuit 110, the gate terminal of the PMOS transistor P1 is at VX, and the source terminal of the PMOS transistor P1 is at VX+Vtp (wherein Vtp is a threshold voltage of a PMOS transistor). The voltage difference between the gate terminal and the drain terminal of the PMOS transistor P2 is (VDD+VX)−(VX+Vtp), which is VDD−Vtp, and is within the nominal voltage VDD. The transistors (transistors P1 and P4 and N3, and the PMOS transistor P2) are well protected within the nominal voltage VDD.

In another exemplary embodiment, the first and second bias circuits 110 and 112 are not limited to diode strings. The first and second bias circuit 110/112 may be implemented by any device that provides a stable voltage shift.

In another exemplary embodiment, the transistor N3/P3 may be replaced by any switch device.

In another exemplary embodiment, the number of PMOS transistors coupled in series between the overdrive voltage source 2VDD+VX and the output terminal OUT is not limited to 3. There may be more PMOS transistors coupled in series in the pull-up circuit 106.

In another exemplary embodiment, the number of NMOS transistors coupled in series between output terminal OUT and the ground terminal VSS is not limited to 3. There may be more NMOS transistors coupled in series in the pull-down circuit 108.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A post driver, comprising:
a pull-up circuit, having a plurality of p-channel metal-oxide-semiconductor transistors coupled in series between an overdrive voltage source and an output terminal of the post driver, wherein a first p-channel metal-oxide-semiconductor transistor has a drain terminal coupled to the output terminal of the post driver;
a pull-down circuit, having a plurality of n-channel metal-oxide-semiconductor transistors coupled in series between the output terminal of the post driver and a ground terminal, wherein a first n-channel metal-oxide-semiconductor transistor has a drain terminal coupled to the output terminal of the post driver;
a first bias circuit, configured to provide a first voltage shift between the output terminal of the post driver and a gate terminal of the first p-channel metal-oxide-semiconductor transistor when the pull-down circuit is enabled, to increase a voltage level at the gate terminal of the first p-channel metal-oxide-semiconductor transistor when the pull-down circuit is enabled;
a second bias circuit, configured to provide a second voltage shift between the output terminal of the post driver and a gate terminal of the first n-channel metal-oxide-semiconductor transistor when the pull-up circuit is enabled, to decrease a voltage level at the gate terminal of the first n-channel metal-oxide-semiconductor transistor when the pull-up circuit is enabled;
a third n-channel metal-oxide-semiconductor transistor, having a gate terminal coupled to a source terminal of the first p-channel metal-oxide-semiconductor transistor, a drain terminal biased by a protection voltage, and a source terminal coupled to the gate terminal of the first p-channel metal-oxide-semiconductor transistor; and
a third p-channel metal-oxide-semiconductor transistor, having a gate terminal coupled to a source terminal of the first n-channel metal-oxide-semiconductor transistor, a drain terminal biased by a nominal voltage of the post driver, and a source terminal coupled to the gate terminal of the first n-channel metal-oxide-semiconductor transistor.

2. The post driver as claimed in claim 1, wherein:
the overdrive voltage source provides an overdrive voltage that is twice the nominal voltage of the post driver plus a delta voltage; and
the first voltage shift and the second voltage shift depend on the delta voltage.

3. The post driver as claimed in claim 2, wherein:
a second p-channel metal-oxide-semiconductor transistor has a drain terminal coupled to the source terminal of the first p-channel metal-oxide-semiconductor transistor; and
when the pull-down circuit is enabled, a voltage level at the drain terminal of the second p-channel metal-oxide-semiconductor transistor is raised due to the first voltage shift, and thereby the second p-channel metal-oxide-semiconductor transistor is protected.

4. The post driver as claimed in claim 3, wherein:
a gate terminal of the second p-channel metal-oxide-semiconductor transistor is biased by the protection voltage that is the nominal voltage plus the delta voltage.

5. The post driver as claimed in claim 2, wherein:
a second n-channel metal-oxide-semiconductor transistor has a drain terminal coupled to the source terminal of the first n-channel metal-oxide-semiconductor transistor; and
when the pull-up circuit is enabled, a voltage level at the drain terminal of the second n-channel metal-oxide-semiconductor transistor drops due to the second voltage shift, and thereby the second n-channel metal-oxide-semiconductor transistor is protected.

6. The post driver as claimed in claim 5, wherein:
a gate terminal of the second n-channel metal-oxide-semiconductor transistor is biased by the nominal voltage.

7. The post driver as claimed in claim 4, wherein:
the first bias circuit comprises a plurality of diodes coupled in series to provide the first voltage shift when the pull-down circuit is enabled.

8. The post driver as claimed in claim 7, wherein:
the first voltage shift balances the delta voltage.

9. The post driver as claimed in claim 6, wherein:
the second bias circuit comprises a plurality of diodes coupled in series to provide the second voltage shift when the pull-up circuit is enabled.

10. The post driver as claimed in claim 9, wherein:
the second voltage shift balances the delta voltage.

11. The post driver as claimed in claim 4, wherein:
a fourth p-channel metal-oxide-semiconductor transistor has a source terminal coupled to the overdrive voltage source, a drain terminal coupled to a source terminal of the second p-channel metal-oxide-semiconductor transistor, and a gate terminal receiving a first control signal,
wherein:

to enable the pull-up circuit, the first control signal is at the level of the protection voltage; and to disable the pull-up circuit, the first control signal is twice the nominal voltage plus the delta voltage.

12. The post driver as claimed in claim 6, wherein:

a fourth n-channel metal-oxide-semiconductor transistor has a source terminal coupled to the ground terminal, a drain terminal coupled to a source terminal of the second n-channel metal-oxide-semiconductor transistor, and a gate terminal receiving a second control signal, wherein:

to enable the pull-down circuit, the second control signal is at the nominal voltage; and to disable the pull-down circuit, the second control signal is at a ground voltage.

13. A chip with overdrive capability, comprising:

the post driver as claimed in claim 2;

a control circuit, providing a first control signal and a second control signal to control the pull-up circuit and the pull-down circuit of the post driver.

14. A post driver, comprising:

a pull-up circuit, having a plurality of p-channel metal-oxide-semiconductor transistors coupled in series between an overdrive voltage source and an output terminal of the post driver, wherein a first p-channel metal-oxide-semiconductor transistor has a drain terminal coupled to the output terminal of the post driver;

a pull-down circuit, having a plurality of n-channel metal-oxide-semiconductor transistors coupled in series between the output terminal of the post driver and a ground terminal, wherein a first n-channel metal-oxide-semiconductor transistor has a drain terminal coupled to the output terminal of the post driver;

a first bias circuit, configured to provide a first voltage shift between the output terminal of the post driver and a gate terminal of the first p-channel metal-oxide-semiconductor transistor when the pull-down circuit is enabled, to increase a voltage level at the gate terminal of the first p-channel metal-oxide-semiconductor transistor when the pull-down circuit is enabled;

a second bias circuit, configured to provide a second voltage shift between the output terminal of the post driver and a gate terminal of the first n-channel metal-oxide-semiconductor transistor when the pull-up circuit is enabled, to decrease a voltage level at the gate terminal of the first n-channel metal-oxide-semiconductor transistor when the pull-up circuit is enabled; and a third n-channel metal-oxide-semiconductor transistor, having a gate terminal coupled to a source terminal of the first p-channel metal-oxide-semiconductor transistor, a drain terminal biased by a protection voltage, and a source terminal coupled to the gate terminal of the first p-channel metal-oxide-semiconductor transistor.

15. The post driver as claimed in claim 14, wherein:

the overdrive voltage source provides an overdrive voltage that is twice a nominal voltage of the post driver plus a delta voltage;

the first voltage shift and the second voltage shift depend on the delta voltage; and the protection voltage coupled to the drain terminal of the third n-channel metal-oxide-semiconductor transistor is the nominal voltage plus the delta voltage.

16. The post driver as claimed in claim 15, wherein:

a second p-channel metal-oxide-semiconductor transistor has a drain terminal coupled to the source terminal of the first p-channel metal-oxide-semiconductor transistor, and a gate terminal biased by the protection voltage; and when the pull-down circuit is enabled, a voltage level at the drain terminal of the second p-channel metal-oxide-semiconductor transistor is raised due to the first voltage shift, and thereby the second p-channel metal-oxide-semiconductor transistor is protected.

17. The post driver as claimed in claim 16, wherein:

a fourth p-channel metal-oxide-semiconductor transistor has a source terminal coupled to the overdrive voltage source, a drain terminal coupled to a source terminal of the second p-channel metal-oxide-semiconductor transistor, and a gate terminal receiving a first control signal, wherein:

to enable the pull-up circuit, the first control signal is at the level of the protection voltage; and to disable the pull-up circuit, the first control signal is twice the nominal voltage plus the delta voltage.

18. A post driver, comprising:

a pull-up circuit, having a plurality of p-channel metal-oxide-semiconductor transistors coupled in series between an overdrive voltage source and an output terminal of the post driver, wherein a first p-channel metal-oxide-semiconductor transistor has a drain terminal coupled to the output terminal of the post driver;

a pull-down circuit, having a plurality of n-channel metal-oxide-semiconductor transistors coupled in series between the output terminal of the post driver and a ground terminal, wherein a first n-channel metal-oxide-semiconductor transistor has a drain terminal coupled to the output terminal of the post driver;

a first bias circuit, configured to provide a first voltage shift between the output terminal of the post driver and a gate terminal of the first p-channel metal-oxide-semiconductor transistor when the pull-down circuit is enabled, to increase a voltage level at the gate terminal of the first p-channel metal-oxide-semiconductor transistor when the pull-down circuit is enabled;

a second bias circuit, configured to provide a second voltage shift between the output terminal of the post driver and a gate terminal of the first n-channel metal-oxide-semiconductor transistor when the pull-up circuit is enabled, to decrease a voltage level at the gate terminal of the first n-channel metal-oxide-semiconductor transistor when the pull-up circuit is enabled; and a third p-channel metal-oxide-semiconductor transistor, having a gate terminal coupled to a source terminal of the first n-channel metal-oxide-semiconductor transistor, a drain terminal biased by a nominal voltage of the post driver, and a source terminal coupled to the gate terminal of the first n-channel metal-oxide-semiconductor transistor.

19. The post driver as claimed in claim 18, wherein:

the overdrive voltage source provides an overdrive voltage that is twice the nominal voltage of the post driver plus a delta voltage; and the first voltage shift and the second voltage shift depend on the delta voltage.

20. The post driver as claimed in claim 18, wherein:

a second n-channel metal-oxide-semiconductor transistor has a drain terminal coupled to the source terminal of the first n-channel metal-oxide-semiconductor transistor, and a gate terminal biased by the nominal voltage; and when the pull-up circuit is enabled, a voltage level at the drain terminal of the second n-channel metal-oxide-semiconductor transistor drops due to the second voltage shift, and thereby the second n-channel metal-oxide-semiconductor transistor is protected.

21. The post driver as claimed in claim 20, wherein:

a fourth n-channel metal-oxide-semiconductor transistor has a source terminal coupled to the ground terminal, a drain terminal coupled to a source terminal of the second n-channel metal-oxide-semiconductor transistor, and a gate terminal receiving a second control signal, wherein:

to enable the pull-down circuit, the second control signal is at the nominal voltage; and to disable the pull-down circuit, the second control signal is at a ground voltage.

\* \* \* \* \*